United States Patent

Seo

[11] Patent Number: 5,877,514
[45] Date of Patent: Mar. 2, 1999

[54] LIQUID CRYSTAL DISPLAY DEVICE INTEGRATED WITH DRIVING CIRCUIT AND METHOD FOR FABRICATING THE SAME

[75] Inventor: Seong Moh Seo, Anyang, Rep. of Korea

[73] Assignee: LG Electronics, Inc., Seoul, Rep. of Korea

[21] Appl. No.: 853,567

[22] Filed: May 9, 1997

[30] Foreign Application Priority Data

May 11, 1996 [KR] Rep. of Korea .................. 1996/15700

[51] Int. Cl.⁶ .......................... H01L 29/04; H01L 31/036
[52] U.S. Cl. .............................. 257/72; 257/59; 257/350; 257/351
[58] Field of Search ................................ 257/59, 72, 350, 257/351

[56] References Cited

U.S. PATENT DOCUMENTS 5,572,046  11/1996  Takemura .................................. 257/66
5,712,495   1/1998  Suzawa ..................................... 257/51

*Primary Examiner*—Ngân V. Ngô
*Attorney, Agent, or Firm*—Morgan, Lewis & Bockius LLP

[57] ABSTRACT

Provided is a method for fabricating a liquid crystal display device integrated with a driver circuit on a substrate, a surface of the substrate being divided into a P-channel region, an N-channel region, and a pixel region. The method includes the steps of forming a gate electrode on each of the P-channel, N-channel, and pixel regions of the substrate; forming a gate insulating layer on the entire surface of the substrate including the gate electrodes; forming a first transparent electrode layer over the gate insulating layer; forming a conductive layer over the first transparent electrode layer; forming a second transparent electrode layer over the conductive layer; removing portions of the first transparent electrode layer, the conductive layer, and the second transparent electrode layer to form source/drain electrodes adjacent the gate electrodes in each of the P-channel, N-channel, and pixel regions of the substrate; doping first impurities into the second transparent electrode layer in the P-channel region; doping second impurities into the second transparent electrode layer in the N-channel region and in the pixel region; forming a semiconductor layer over the entire surface of the substrate; annealing the semiconductor layer; forming a passivation layer over the entire surface of the substrate; and removing portions of the passivation layer, the second transparent electrode, and the conductive layer in the pixel region to expose a portion of the first transparent electrode layer.

16 Claims, 7 Drawing Sheets

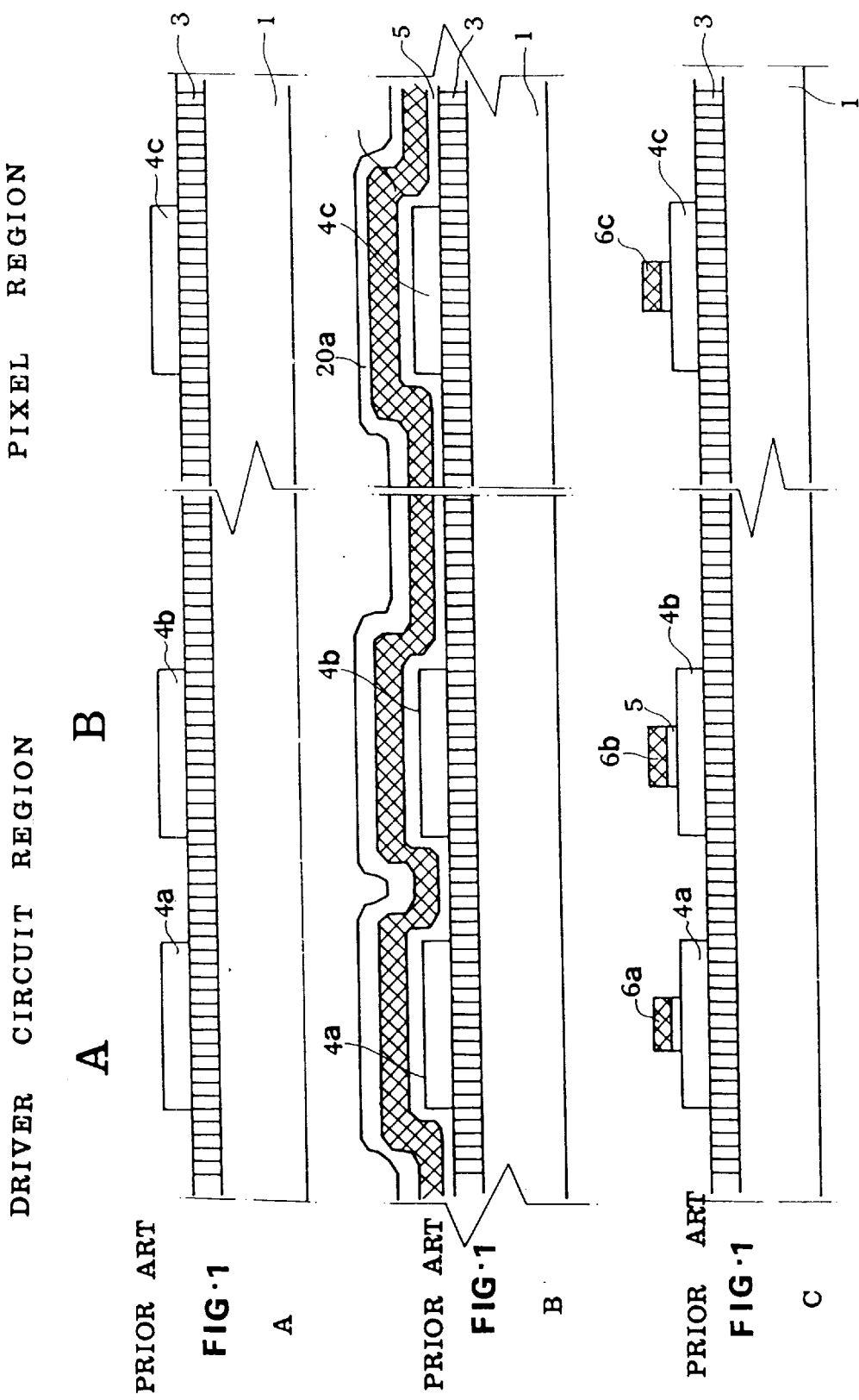

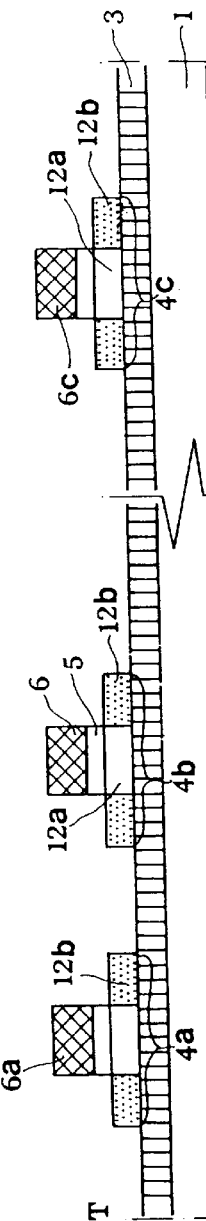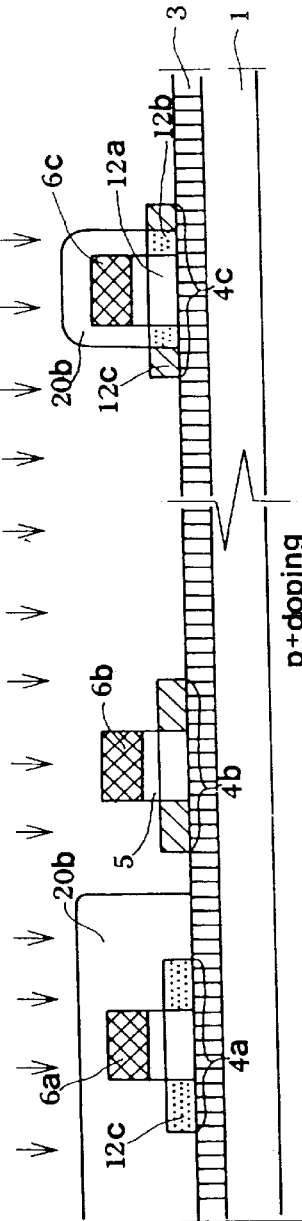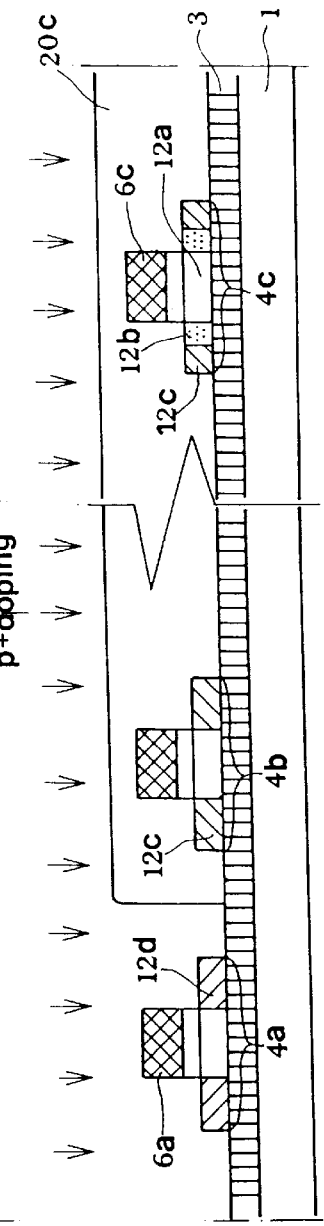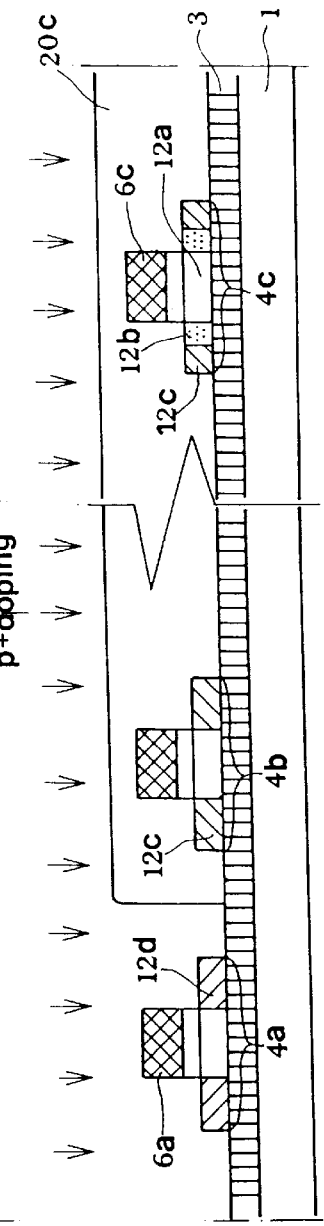
PRIOR ART
FIG. 1 D
PRIOR ART
FIG. 1 E
PRIOR ART
FIG. 1 F

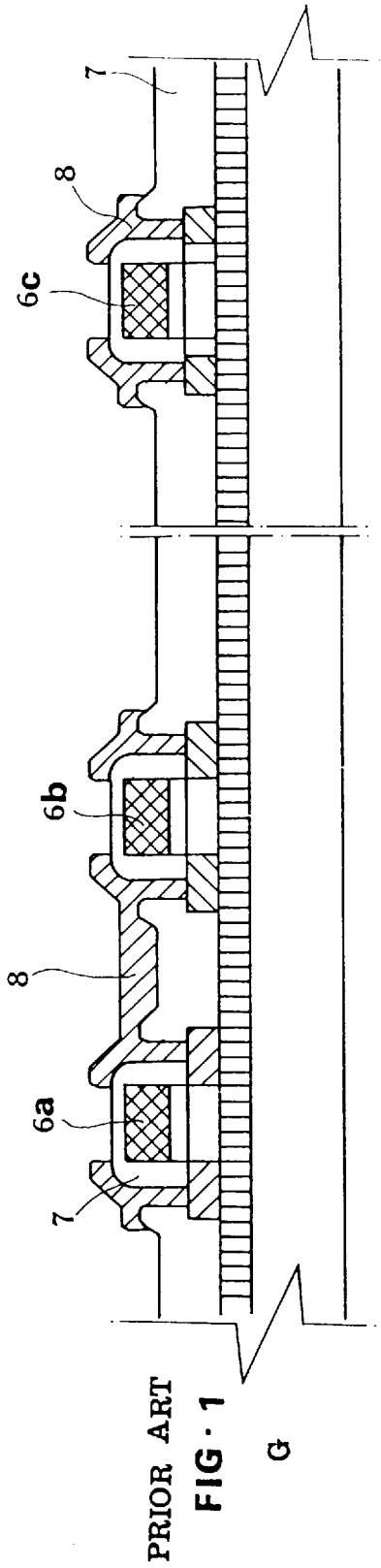
PRIOR ART
FIG. 1 G
PRIOR ART
FIG. 1 H

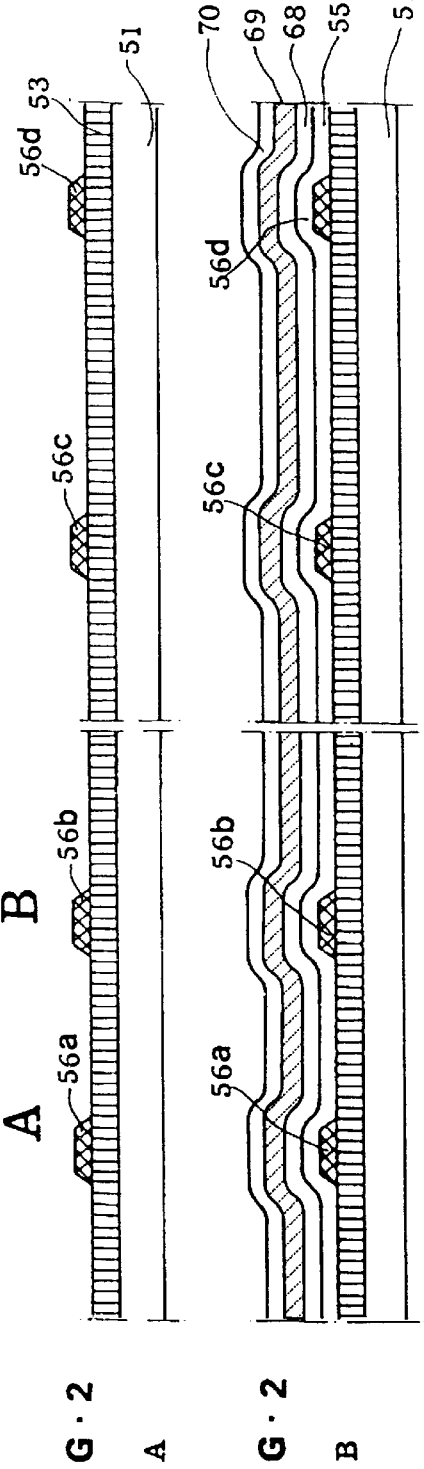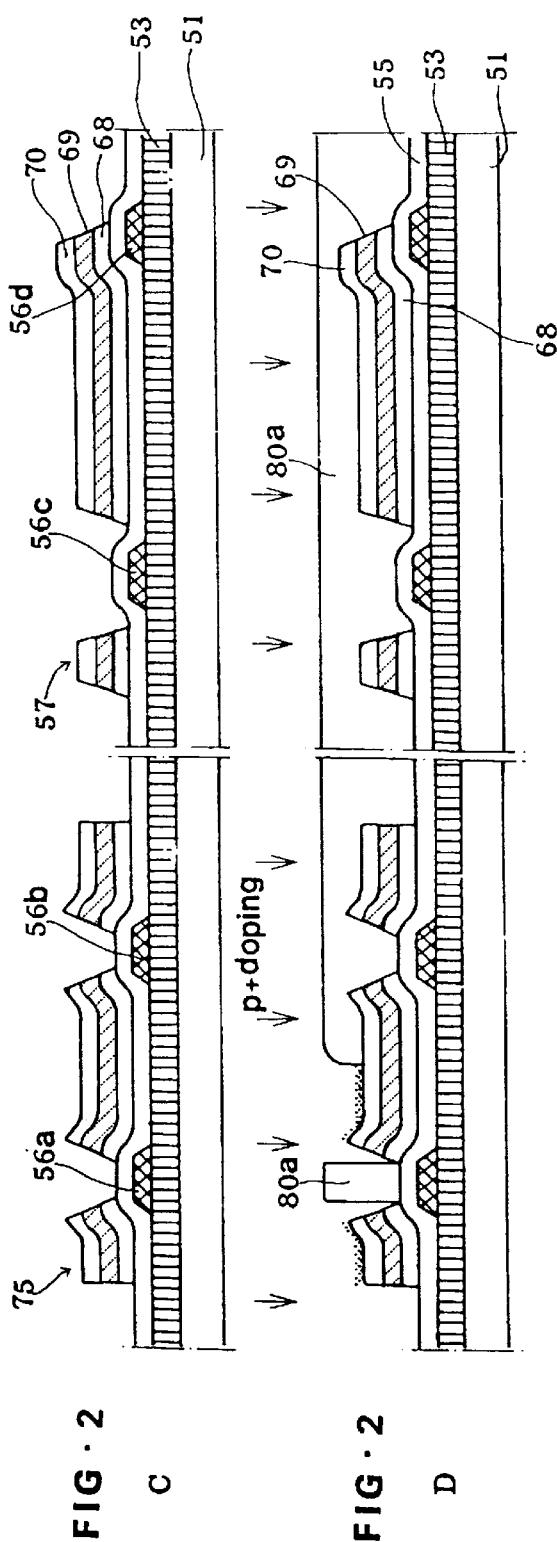

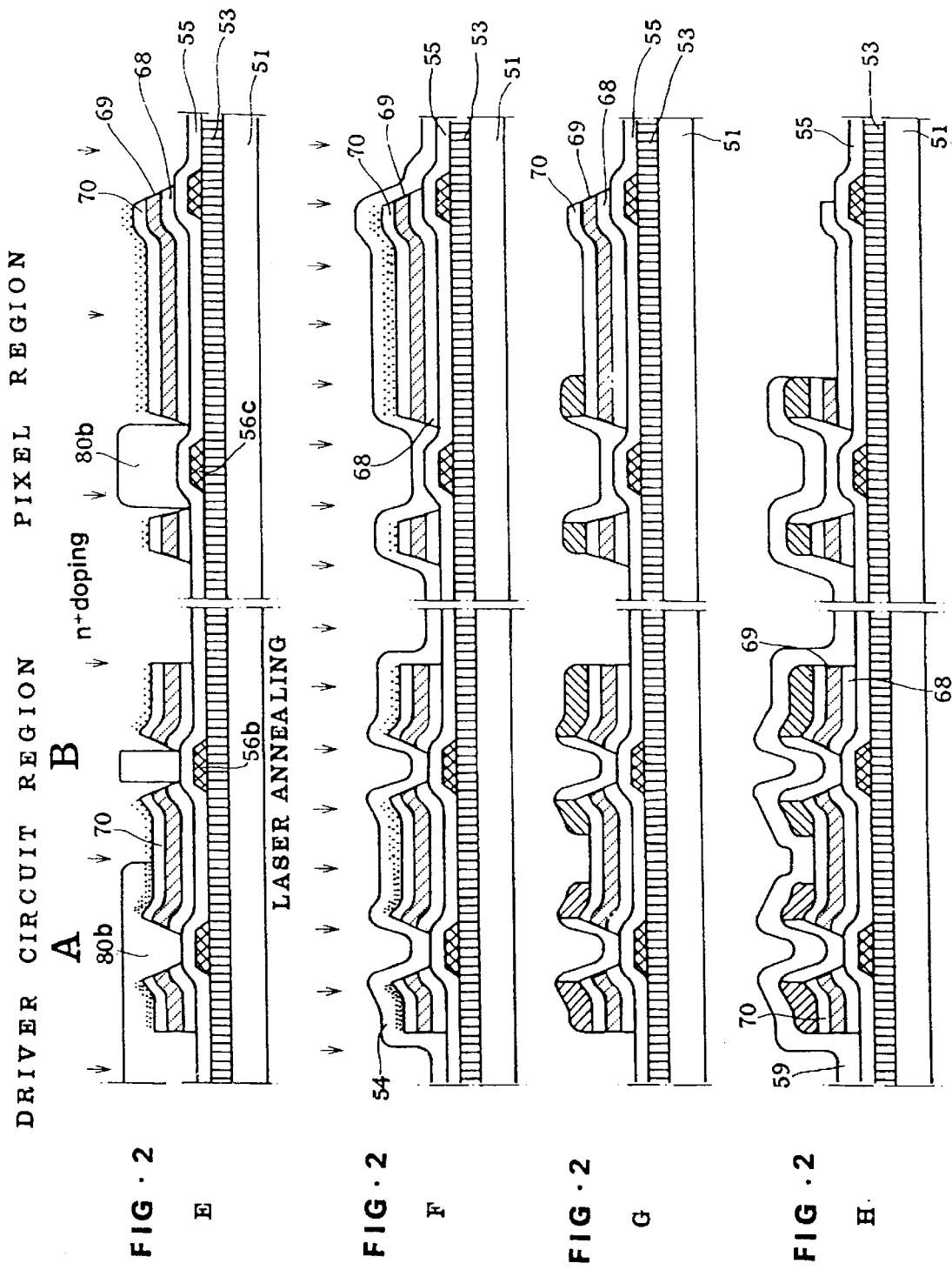

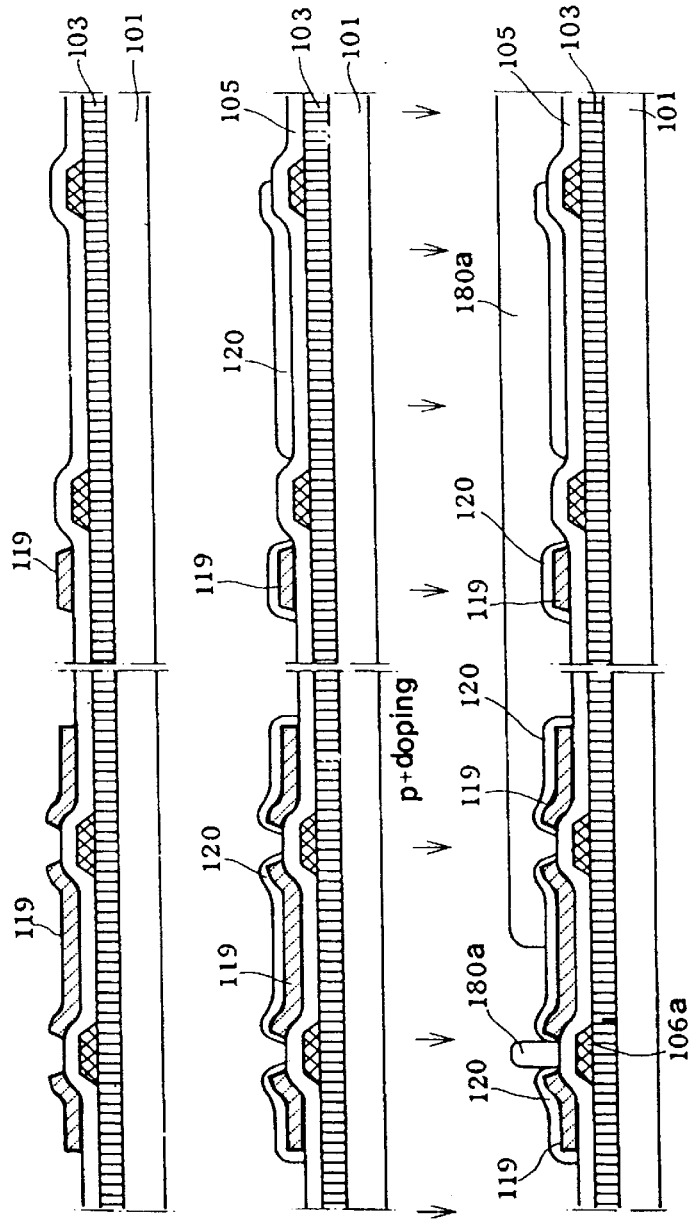

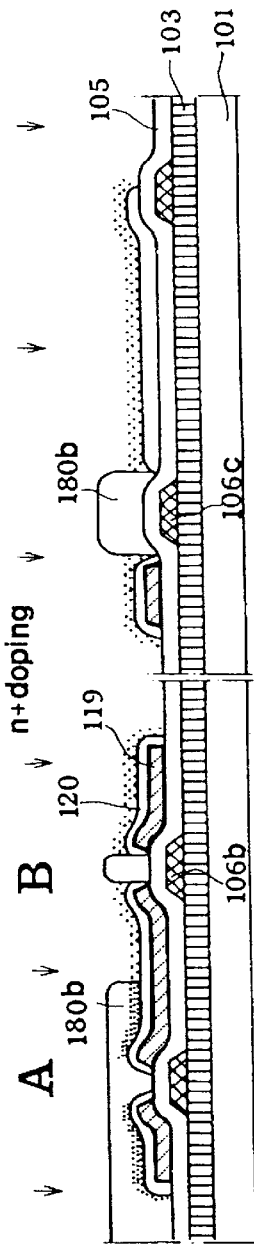
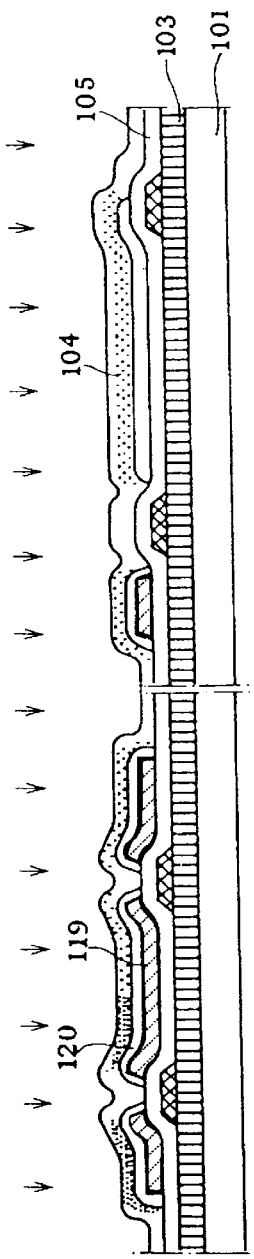
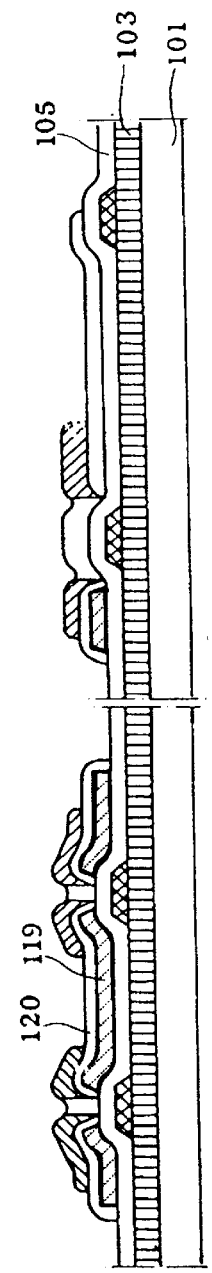
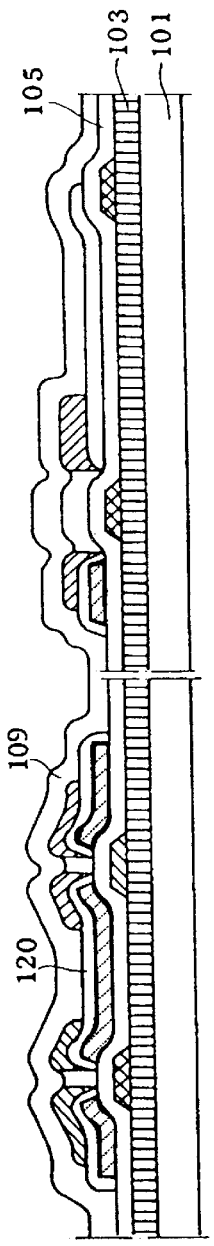
FIG. 3 F
FIG. 3 G
FIG. 3 H
FIG. 3 I

LIQUID CRYSTAL DISPLAY DEVICE INTEGRATED WITH DRIVING CIRCUIT AND METHOD FOR FABRICATING THE SAME

This application claims the benefit of Application Ser. No. 15700/1996, filed in Korea on May 11, 1996, which is hereby incorporated by reference.

BACKGROUND OF THE INVENTION

1. Field of the Invention

The present invention relates to a liquid crystal display device, and more particularly, to a liquid crystal display device in which a pixel driving thin film transistor(TFT) and a driver circuit region are integrated on the same panel.

2. Discussion of the Related Art

An active matrix liquid crystal display used for a liquid crystal display (LCD) with large area and high resolution includes a pixel driving TFTs for driving display pixels and a driver circuit TFTs for applying signals to gate bus lines and data bus lines coupled to the pixel driving TFTs.

In general, there are two types of driver circuit unit. The first one is such that the driver circuit unit is a separate integrated circuit for driving signal lines, and the integrated circuit is attached to one end of the substrate of the liquid crystal panel. The second type is such that the driver circuit unit is formed on an LC panel as one piece. In the second type, typically, complementary metal oxide semiconductor TFTs (CMOS TFTs) using polycrystalline silicon (p-Si) with a high electric field effect mobility have been used for the driver circuit. Since these CMOS TFTs are made of p-Si, the switching speed is much higher than that for amorphous silicon TFTs. Further, because the driver circuit TFTs and the pixel driving TFTs may be fabricated at the same time, the fabrication cost can be reduced.

FIGS. 1A to FIG. 1H are drawings showing a method of fabricating a conventional liquid crystal display device integrated with a driver circuit. A substrate 1 is divided into a pixel region and a driver circuit region. The driver circuit region is further divided into a part B for N-channel metal oxide semiconductor TFTs(NMOS TFTs) and a part A for P-channel metal oxide semiconductor TFTs(PMOS TFTs).

As shown in FIG. 1A, a buffer layer 3 is provided on the substrate 1, and then p-Si is deposited on the buffer layer 3 and patterned to form semiconductor layers 4a, 4b, 4c in the pixel region and the driver circuit region. As a result, one semiconductor layer 4c is provided on the pixel region and two semiconductor layers 4a, 4b are formed on the driver circuit region. The semiconductor layer 4c formed on the pixel region is for a pixel driving TFT for driving the pixel. The semiconductor layers 4b, 4c are for NMOS and PMOS TFTs, respectively.

As shown in FIG. 1B, an insulating layer 5, such as SiO$_2$ or SiNx, a metal layer 6, such as Al, Al alloy, or Cr, and photoresist 20a are successively formed over the substrate 1. The insulating layer 5 and the metal layer 6 are patterned by photolithography to form a gate insulating layer 5 and gate electrodes 6a, 6b, 6c, as shown in FIG. 1C. Subsequently, as shown in FIG. 1D, n$^-$doping in low impurity-concentration is executed into the entire surface of the substrate 1 to form an n$^-$layer 12b and a channel layer 12a in each of the semiconductor layers 4a, 4b, 4c. Here, the n$^-$type ions are blocked by the gate electrodes 6a, 6b, 6c, and do not reach the channel layer 12a.

Thereafter, as shown in FIG. 1E, in order to form a lightly doped drain (LDD) structure, n$^+$doping in high impurity concentration is executed after a photoresist layer 20b is deposited over the substrate and patterned to cover part A of the driver circuit region, the gate electrode 6c, and some part of the semiconductor layer 4c of the pixel region.

Accordingly, n$^+$layers 12c are formed by the n$^+$doping in the semiconductor layers of the pixel region and part B of the driver circuit region. The LDD structure is made by forming n$^+$layer 12c with high impurity-concentration and n$^+$layer 12b with low impurity-concentration in the semiconductor layer 4c of the pixel region As shown in FIG. 1F, after photoresist layer 20b is removed, another photoresist layer 20c is deposited and patterned to cover the pixel region and part B of the driver circuit region. Then, p$^+$doping with high impurity-concentration is executed to form p$^+$layer 12d in part A of the driver circuit region.

Such a method of forming a p$^+$layer is called a counter doping method. When the n$^-$doping is executed, the concentration of ions doped in the semiconductor layers is about $10^{16}$–$10^{18}$ atoms/cm$^3$, and when the p$^+$doping is executed, the concentration of ions doped in the semiconductor layer is about $10^{19}$–$10^{21}$ atoms/cm$^3$. Therefore, the n$^-$layer becomes a p$^+$layer by the p$^+$doping. This way, TFTs having an LDD structure including the n$^+$layers 12c and n$^-$layers 12b are formed in the pixel region, and CMOS TFTs having NMOS TFTs including the n$^+$layers 12c and PMOS TFTs including the p-layers 12d are formed in the driver circuit region.

As shown in FIG. 1G, after the photoresist layer 20c is removed, an insulating layer 7, such as SiNx or SiO$_2$, is deposited over the entire surface of the substrate 1. Contact holes are then formed in the insulating layer 7, and a metal such as Al is deposited and patterned to form source/drain electrodes 8.

And, as shown in FIG. 1H, after indium tin oxide (ITO) is deposited and patterned to form a transparent electrode 9 [a passivation layer 10 is further deposited]. Finally, TFTs having an LDD structure are formed in the pixel region and CMOS TFTs are formed in the driver circuit region, thereby completing a liquid crystal display device integrated with a driver circuit.

However, the liquid crystal display device integrated with a driver circuit formed by the above-mentioned method have complex processes.

SUMMARY OF THE INVENTION

Accordingly, the present invention is directed to a liquid crystal display device integrated with a driving circuit and a method for fabricating the same that substantially obviates one or more of the problems due to limitations and disadvantages of the related art.

An object of the present invention is to provide a liquid crystal display device integrated with a driver circuit in which source/drain electrodes and bus lines have high reliability against disconnection and which has a simpler fabrication process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a method for fabricating a liquid crystal display device integrated with a driver circuit on a substrate, a surface of the substrate being divided into a P-channel region, an N-channel region, and a pixel region, the method including the steps of forming a gate electrode on each of the P-channel, N-channel, and pixel regions of the substrate; forming a gate insulating layer on the entire surface of the substrate including the gate electrodes; forming a first transparent electrode layer over the gate insulating layer; forming a conductive layer over the first transparent electrode layer; forming a second transparent electrode layer over the conductive layer; removing portions of the first transparent electrode layer, the conductive layer, and the second transparent electrode layer to form source/drain electrodes adjacent the gate electrodes in each of the P-channel, N-channel, and pixel regions of the substrate; doping first impurities into the second transparent electrode layer in the P-channel region; doping second impurities into the second transparent electrode layer in the N-channel region and in the pixel region; forming a semiconductor layer over the entire surface of the substrate; annealing the semiconductor layer; forming a passivation layer over the entire surface of the substrate; and removing portions of the passivation layer, the second transparent electrode, and the conductive layer in the pixel region to expose a portion of the first transparent electrode layer.

In another aspect, the present invention provides a method for fabricating a liquid crystal display device integrated with a driver circuit on a substrate, a surface of the substrate being divided into a P-channel region, an N-channel region, and a pixel region, the method including the steps of forming a gate electrode on each of the P-channel, N-channel, and pixel regions of the substrate; forming a gate insulating layer on the entire surface of the substrate including the gate electrodes; depositing and patterning a metal layer over the gate insulating layer to form a metal line in each of the N-channel, P-channel, and pixel regions; forming transparent electrodes on the metal lines and on a portion of the gate insulating layer in the pixel region; doping first impurities into the transparent electrodes in the P-channel region; doping second impurities into the transparent electrodes in the N-channel region and in the pixel region; forming a semiconductor layer over the entire surface of the substrate; annealing the semiconductor layer; and forming a passivation layer over the entire surface of the substrate.

In another aspect, the present invention provides a liquid crystal display device integrated with a driver circuit, including a substrate having a pixel region and a driver circuit region; a P-channel metal oxide semiconductor thin film transistor formed in a portion of the driver circuit region, the P-channel transistor having a gate electrode, a gate insulating layer, source/drain electrodes over the gate insulating layer adjacent the gate electrode, ohmic layers each made of P type polycrystalline semiconductor on the source/drain electrodes, and a channel layer including intrinsic polycrystalline semiconductor on the gate insulating layer, the channel layer being in contact with the ohmic layers; an N-channel metal oxide semiconductor thin film transistor formed in a portion of the driver circuit region, the N-channel transistor having a gate electrode, a gate insulating layer, source/drain electrodes over the gate insulating layer adjacent the gate electrode, ohmic layers each made of N type polycrystalline semiconductor on the source/drain electrodes, and a channel layer including intrinsic polycrystalline semiconductor on the gate insulating layer, the channel layer being in contact with the ohmic layers; a pixel driving metal oxide semiconductor thin film transistor formed in the pixel region, the pixel driving transistor having a gate electrode, a gate insulating layer, source/drain electrodes over the gate insulating layer adjacent the gate electrode, ohmic layers each made of N type polycrystalline semiconductor on the source/drain electrodes, and a channel layer including intrinsic polycrystalline semiconductor on the gate insulating layer, the channel layer being in contact with the ohmic layers; and a passivation layer formed over the entire surface of the substrate to cover the N-channel transistor, the P-channel transistor, and the pixel driving transistor.

In another aspect, the present invention provides a liquid crystal display device integrated with a driver circuit, comprising: a substrate having a pixel region, an N-channel region, and a P-channel region; a gate electrode in each of the N-channel region, the P-channel region, and the pixel region over the substrate; a gate insulating layer formed over each of the gate electrodes; source/drain electrodes over the gate insulating layer adjacent each of the gate electrodes; a first ohmic layer including P type polycrystalline semiconductor on the source/drain electrodes in the P-channel region; a second ohmic layer including N type polycrystalline semiconductor on the source/drain electrodes in the N-channel region and in the pixel region; a channel layer including intrinsic polycrystalline semiconductor on the gate insulating layer over the gate electrode in each of the N-channel region, the P-channel region, and the pixel region; and a passivation layer on the entire surface of the substrate including the channel layer, the first ohmic layer, and the second ohmic layer.

In another aspect, the present invention provides a method of manufacturing a liquid crystal display device integrated with a driving circuit including the steps of depositing a buffer layer on a substrate having a pixel region and a driver circuit region, forming a gate electrode by depositing and patterning a metal layer provided on the entire substrate, depositing a first transparent electrode, a metal layer, and a second transparent electrode after depositing a gate insulating layer, forming the metal line and a data line by patterning the first transparent electrode, the metal layer, and the second transparent electrode, doping n+ ions into the entire surface of the substrate in state that the pixel region and the gate electrode on part A of the driver circuit region and part B of the driver circuit region are blocked by depositing and patterning a photoresist, doping n+ ions into the entire surface of the substrate in state that part B of the driver circuit region and the gate electrode of the pixel region and the gate electrode of part B of the driver circuit region are blocked by depositing and patterning another photoresist after the former(photoresist) is removed, forming an amorphous silicon(a-Si) layer over the entire substrate, annealing by laser irradiation into the amorphous silicon layer, patterning the amorphous silicon layer, and after forming a passivation layer, removing the passivation layer, the second transparent electrode of the pixel region, and the metal layer.

In another aspect, the present invention provides a method for fabricating a liquid crystal display device integrated with a driver circuit including the steps of forming a gate electrode on a buffer layer deposited on a substrate divided into a pixel region and a driver circuit region; depositing and patterning a metal layer over the entire surface of the substrate to form a metal line and a data line after form the gate insulating layer on the substrate; forming a transparent electrode on the data line and the metal line and the pixel region; doping a first impurity into the entire surface of the substrate in which a small portion of the driver circuit region and the pixel region and a gate electrode on another portion of the driver circuit region are blocked; doping a second impurity into the entire surface of the substrate in which another portion of the substrate which have the first impurity doping region and the gate electrode on another portion of the driver circuit region and the gate electrode on the pixel region are blocked; forming a semiconductor layer over the entire surface of the substrate; annealing the semiconductor layer by irradiating a laser beam; patterning the semiconductor layers; and removing the transparent electrode and the metal line of the pixel region after depositing a passivation layer.

In another aspect, the present invention provides a liquid crystal display device integrated with a driver circuit including a substrate having a pixel region and a driver circuit region; a buffer layer over the substrate; a positive metal oxide semiconductor thin film transistor formed on a part portion of the driver circuit region having a gate electrode, a plurality of metal layers, an ohmic layer including P type polycrystalline semiconductor formed on the semiconductor layer, and a channel layer including an intrinsic polycrystalline semiconductor; a negative metal oxide semiconductor thin film transistor formed on another portion of the driver circuit region having the gate electrode, the plurality of metal layers, the ohmic layer including N type polycrystalline semiconductor formed on the semiconductor layer, and the channel layer including the intrinsic polycrystalline semiconductor; a pixel driving thin film transistor having the gate electrode, the plurality of metal layers, the ohmic layer including N type polycrystalline semiconductor formed on the semiconductor layer, and the channel layer including the intrinsic polycrystalline semiconductor; a gate insulating layer provided on the gate electrode and the buffer layer; and a passivation layer provided on the pixel region and the driver circuit region.

In a further aspect, the present invention provides a liquid crystal display device integrated with a driver circuit including a substrate having a pixel region and a driver circuit region; a buffer layer formed on the substrate; a plurality of gate electrodes formed on the buffer layer; a gate insulating layer formed on the gate electrode; a metal layer provided on the pixel region and the driver circuit region; a first ohmic layer including P type polycrystalline semiconductor formed on the metal layer of a part portion of the driver circuit region; a second ohmic layer including N type polycrystalline semiconductor formed on another portion and the metal layer of the pixel region; a channel layer including the intrinsic polycrystalline semiconductor formed on the metal layer of the driver circuit region and the pixel region; and a passivation layer provided on the pixel region and the driver circuit region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 1A to 1H are drawings showing a method of fabricating a conventional liquid crystal display device integrated with a driver circuit.

FIGS. 2A to 2H are drawings showing a method of fabricating a liquid crystal display device integrated with driver circuit according to a first embodiment of the present invention.

FIGS. 3A to 3I are drawings showing a method of fabricating a liquid crystal display device integrated with a driver circuit according to a second embodiment of the present invention.

DETAILED DESCRIPTION OF THE PREFERRED EMBODIMENTS

Reference will now be made in detail to the preferred embodiments of the present invention, examples of which are illustrated in the accompanying drawings.

FIGS. 2A to 2H are drawings showing a method for fabricating a liquid crystal display device integrated with a driver circuit according to the first embodiment of the present invention. A TFT used in this embodiment is an inverted coplanar p-Si TFT.

A substrate 51 is divided into a pixel region and a driver circuit region, in which the pixel region includes a pixel driving TFT and a pixel electrode, and the driver circuit region includes a driver circuit TFT applying video signals to the pixel electrode and controlling the pixel driving TFT. Further, the driver circuit region is divided into a part A having PMOS TFT and a part B having NMOS TFTs.

As shown in FIG. 2A, a metal, such as Al or Cr, is deposited on a buffer layer 53 made of an insulating film such as $SiO_2$ over a substrate 51, and patterned to form gate electrodes 56a, 5Gb, 56c and 56d. Further, as shown in FIG. 2B, a gate insulating layer 55 is deposited on the gate electrodes 56a, 56b, 56c and 57d and over the entire surface of the substrate 51. After contact holes (not illustrated) are formed at a connecting portion of a metal line to be formed in the driver circuit region, the first transparent electrode 68, the metal layer 69 such as Mo, and the second transparent electrode 70 are successively deposited. As material for the first transparent electrode and the second transparent electrode, indium tin oxide ITO can be used, for example. As shown in FIG. 2C, the first transparent electrode 68, the metal layer 69, and the second transparent electrode 70 are patterned by using a mask to form a metal line 75 of the driver circuit region and a data line 57 of the pixel region (source/drain electrodes).

Thereafter, as shown in FIG. 2D, $p^+$doping is executed after a photoresist layer 80a is deposited and patterned to block the pixel region, part B of the driver circuit region, and a gate electrode 56a of part A in the driver circuit region. This ion doping is executed by an ion shower doping system using $B_2H_6/H_2$ gas. In this process, the P type ions ($B^+$) diffuse into the inside of the second transparent electrode 70 formed on part A of the driver circuit region, but most of ions ($B^+$) remain on the second transparent electrode 70.

Further, as shown in FIG. 2E, $n^+$doping is executed after the photoresist layer 80a is removed, and another photoresist layer 80b is deposited and patterned to block the part A of the driver circuit region, the gate electrode 56b of the part B in the driver circuit region, and the gate electrode 56c in the pixel region. This ion doping is executed by an ion shower doping system using $PH_3/H_2$ gas, and most of the N type ions ($P^+$) remains on the second transparent electrode 70.

Thereafter, as shown in FIG. 2F, after the photoresist layer 80b is removed, a semiconductor layer 54 made of a-Si is deposited over the entire surface of the substrate 51. Then, excimer laser beam annealing is once executed for the substrate 51. Since a-Si is crystallized by the laser annealing, the a-Si semiconductor layer is transformed into the p-Si semiconductor layer, and N type ions ($P^+$) and P type ions ($B^+$) that have remained on the second transparent electrode 70 diffuse into the semiconductor 54. As a result, the ohmic layer made of the N type p-Si is formed in the semiconductor layer in the pixel region and part B of the driver circuit region by diffusion of P+ions, and another ohmic layer made of the P type p-Si is formed in the semiconductor layer 54 formed on part A of the driver circuit region by the diffusion of B+ions. Also, a channel layer 62a made of intrinsic p-Si is formed on the semiconductor layer over the gate electrodes. This layer is intrinsic (non-doped), because ions are blocked by the photoresist layers 80a, 80b.

As shown in FIG. 2G, a pixel driving TFT is formed in the pixel region and a CMOS TFT is formed on the driver circuit region by patterning the semiconductor layer 54.

Therefore, the pixel driving TFT having the channel layer made of intrinsic p-Si and the ohmic layer made of N type p-Si are formed in the pixel region, and the CMOS TFT having the PMOS TFT including the ohmic layer made of P type p-Si and the channel layer made of intrinsic p-Si and the NMOS TFT including the ohmic layer made of N type p-Si and the channel layer made of intrinsic p-Si are formed in the driver circuit region.

As shown in FIG. 2H, the liquid crystal device integrated with a driver circuit in accordance with the present invention is completed by depositing and patterning a passivation layer 59 that includes insulating material such as SiNx or $SiO_2$, and by removing portions of the passivation layer 59, the second transparent electrode 70, and the metal layer 69 of the pixel region. Accordingly, only the first transparent electrode 68 remains in the display area of the pixel region, thereby constituting a pixel electrode. Because the passivation layer can contain a large amount of hydrogen, it is possible to skip a hydrogenation process by annealing through heat-treatment. Also in this case, because the hydrogen atoms have a large diffusion coefficient, the hydrogen atoms are freely moveable upon the heat treatment and reach the interface between the channel layer and the gate insulating layer. As a result, an interfacial characteristics between the channel layer and the gate insulating layer can be improved, thereby improving the function of the transistor.

The method described above requires only seven masks: for forming the gate electrode, for the contact holes in the driver circuit region, for the data line of the pixel region and the metal line of the driver circuit region, for patterning the photoresist used to dope the P type ions, for patterning the photoresist used to dope the N type ions, for the semiconductor layer, and for removing the metal line and the transparent electrode in the pixel region. Further, TFTs in the pixel region and the driver circuit region on the same panel are fabricated by the excimer laser beam radiation which executes crystallization and activation at the same time after ion-doping, whereby the fabricating process is simply executed. Also, the metal line formed in the driver circuit region and the source/drain electrodes in the pixel driving TFT, and the data line are formed with a triple structure including the first transparent electrode, the metal layer, and the second transparent electrode. Therefore, these electrodes have high reliability against disconnection or cutoff.

FIGS. 3A to 3H are drawings showing the method for fabricating a liquid crystal display device integrated with a driver circuit according to a second embodiment of the present invention.

A substrate 101 is divided into a pixel region and a driver circuit region, in which the driver circuit region is divided further into a part A for PMOS TFT formation and part B for NMOS TFT formation.

As shown in FIG. 3A, a metal, such as Al or Cr, is deposited on a buffer layer 103 made of insulating material such as $SiO_2$ over the substrate 101 and patterned to form gate electrodes 106a, 106b, 106c and 106d. As shown in FIG. 3B, a gate insulating layer 105 is deposited on the gate electrodes 106a, 106b, 106c and 106d and over the entire surface of the substrate 101. Contact holes (not illustrated) are formed at a connecting portion of a metal line to be formed on the driver circuit region. Further, as shown in FIG. 3C, metal lines in the driver circuit region and the data line of the pixel region (source/drain electrodes) are formed by depositing and patterning a metal layer 119 including metal such as Mo. As shown in FIG. 3D, transparent electrodes 120 are formed on the metal layer 119 and in the pixel region by depositing and patterning transparent conductive material such as indium tin oxide. The transparent electrodes 120 are formed to cover the entire edges of the metal layers 119. This is because the ohmic contact can be obtained at the edges when ion doping is executed later.

Thereafter, as shown in FIG. 3E, p+doping is executed after a photoresist layer 180a is deposited and patterned to block the pixel region, part B of the driver circuit region, and the gate electrode 106a of part A of the driver circuit region. This ion doping is executed by an ion shower doping system using $B_2H_6/H_2$ gas, for example. As shown in FIG. 3F, n+doping is executed after the photoresist layer 180a is removed, and another photoresist layer 180b is deposited and patterned to block the part A of the driver circuit region, the gate electrode 106b of the part B of the driver circuit region, and the gate electrode 106c of the pixel region. This ion doping is executed by an ion shower doping system using $PH_3/H_2$ gas, for example. After these doping steps, most of the ions (P+, B+) remains on the transparent electrode 120.

Thereafter, as shown in FIG. 3G, after depositing a semiconductor layer 104 made of a-Si over the entire surface of the substrate 101, excimer laser beam annealing is once executed. Since a-Si is crystallized by the laser annealing, the a-Si semiconductor layer is transformed into a p-Si semiconductor layer, and at the same time, ions(P+, B+) that have remained on the transparent electrode 120 diffuse into the semiconductor layer 104, thereby forming an ohmic layer.

Therefore, as shown in FIG. 3H, a pixel driving TFT having the channel layer made of intrinsic p-Si and the ohmic layer made of N type p-Si is formed in the pixel region, and a CMOS TFT having the PMOS TFT including the ohmic layer made of P type p-Si and the channel layer made of intrinsic p-Si and the NMOS TFT including the ohmic layer made of N type p-Si and the channel layer made of intrinsic p-Si is formed in the driver circuit region.

Further, as shown in FIG. 3I, the liquid crystal device integrated with a driver circuit according to the present invention is completed by depositing a passivation layer 119 including insulating material such as SiNx or $SiO_2$. If a large amount of hydrogen is contained in the passivation layer, interfacial characteristics between the channel layer and the gate insulating layer can be improved, whereby the function of the thin film transistor is improved.

In the second embodiment, the data line and the source/drain electrodes in the pixel region and the metal line in the driver circuit region are doubly formed using the metal layer and the transparent. The second embodiment requires eight masks: for forming the gate electrode, for forming the contact hole in the driver circuit region, for forming the data line and the source/drain electrode in the pixel region and the metal line in the driver circuit region, for patterning the photoresist used to dope the P type ions, for patterning the photoresist used to dope the N type ions, for forming the semiconductor layer, for forming the transparent electrode, and for removing the metal line and the transparent electrode in the pixel region. Using this method, it becomes possible to manufacture TFTs in the pixel region and in the driver circuit region on the liquid crystal panel at the same time. Also, the metal line in the driver circuit region and the data line and the source/drain electrodes in the pixel region are doubly formed, thereby improving reliability against disconnection or the like.

By a liquid crystal display device integrated with a driver circuit according to the present invention, it becomes possible to prevent disconnection or the like of a source/drain electrode and a metal line. Also, it is fabricated by simple process.

It will be apparent to those skilled in the art that various modifications and variations can be made in the liquid crystal display device integrated with driving circuit and method for fabricating the same of the present invention without departing from the spirit or scope of the invention. Thus, it is intended that the present invention cover the modifications and variations of this invention provided they come within the scope of the appended claims and their equivalents.

what is claimed is:

1. A liquid crystal display device integrated with a driver circuit, comprising:
   a substrate having a pixel region and a driver circuit region;
   a P-channel metal oxide semiconductor thin film transistor formed in a portion of the driver circuit region, the P-channel transistor having a gate electrode, a gate insulating layer, source/drain electrodes over the gate insulating layer adjacent the gate electrode, ohmic layers each made of P type polycrystalline semiconductor on the source/drain electrodes, and a channel layer including intrinsic polycrystalline semiconductor on the gate insulating layer, the channel layer being in contact with the ohmic layers;
   an N-channel metal oxide semiconductor thin film transistor formed in a portion of the driver circuit region, the N-channel transistor having a gate electrode, a gate insulating layer, source/drain electrodes over the gate insulating layer adjacent the gate electrode, ohmic layers each made of N type polycrystalline semiconductor on the source/drain electrodes, and a channel layer including intrinsic polycrystalline semiconductor on the gate insulating layer, the channel layer being in contact with the ohmic layers;
   a pixel driving metal oxide semiconductor thin film transistor formed in the pixel region, the pixel driving transistor having a gate electrode, a gate insulating layer, source/drain electrodes over the gate insulating layer adjacent the gate electrode, ohmic layers each made of N type polycrystalline semiconductor on the source/drain electrodes, and a channel layer including intrinsic polycrystalline semiconductor on the gate insulating layer, the channel layer being in contact with the ohmic layers; and
   a passivation layer formed over the entire surface of the substrate to cover the N-channel transistor, the P-channel transistor, and the pixel driving transistor.

2. The liquid crystal display device according to claim 1, wherein the source/drain electrodes of the P-channel transistor, the N-channel transistor, and the pixel driving transistor each include a first transparent electrode, a metal layer on the first transparent electrode, and a second transparent electrode on the metal layer.

3. The liquid crystal display device according to claim 2, wherein the first transparent electrode and the second transparent electrode each include indium tin oxide.

4. The liquid crystal display device according to claim 2, wherein the metal layer includes Mo.

5. The liquid crystal display device according to claim 1, wherein the source/drain electrodes of the P-channel transistor and the N-channel transistor each include a metal layer and a transparent electrode on the metal layer.

6. The liquid crystal display device according to claim 5, wherein the transparent electrode includes indium tin oxide.

7. The liquid crystal display device according to claim 5, wherein the metal layer includes Mo.

8. The liquid crystal display device according to claim 1, further comprising a buffer layer on the entire surface of the substrate, the P-channel transistor, the N-channel transistor, and the pixel driving transistor being formed over the buffer layer.

9. A liquid crystal display device integrated with a driver circuit, comprising:
   a substrate having a pixel region, an N-channel region, and a P-channel region;
   a gate electrode in each of the N-channel region, the P-channel region, and the pixel region over the substrate;
   a gate insulating layer formed over each of the gate electrodes;
   source/drain electrodes over the gate insulating layer adjacent each of the gate electrodes;
   a first ohmic layer including P type polycrystalline semiconductor on the source/drain electrodes in the P-channel region;
   a second ohmic layer including N type polycrystalline semiconductor on the source/drain electrodes in the N-channel region and in the pixel region;
   a channel layer including intrinsic polycrystalline semiconductor on the gate insulating layer over the gate electrode in each of the N-channel region, the P-channel region, and the pixel region; and
   a passivation layer on the entire surface of the substrate including the channel layer, the first ohmic layer, and the second ohmic layer.

10. The liquid crystal display device according to claim 9, wherein the source/drain electrodes in each of the N-channel region, the P-channel region, and the pixel region include a first transparent electrode, a metal layer on the first transparent electrode, and a second transparent electrode on the metal layer.

11. The liquid crystal display device according to claim 10, wherein the first transparent electrode and the second transparent electrode each include indium tin oxide.

12. The liquid crystal display device according to claim 10, wherein the metal layer includes Mo.

13. The liquid crystal display device according to claim 9, wherein the source/drain electrodes that are located in the P-channel and N-channel regions include a transparent electrode and a metal layer on the transparent electrode.

14. The liquid crystal display device according to claim 13, wherein the transparent electrode includes indium tin oxide.

15. The liquid crystal display device according to claim 13, wherein the metal layer includes Mo.

16. The liquid crystal display device according to claim 9, further comprising a buffer layer on the entire surface of the substrate and below the gate electrodes.

* * * * *